United States Patent
Nowak et al.

(10) Patent No.: US 9,887,192 B2
(45) Date of Patent: Feb. 6, 2018

(54) INTERCONNECTS FOR VERTICAL-TRANSPORT FIELD-EFFECT TRANSISTORS

(71) Applicant: GLOBALFOUNDRIES Inc., Grand Cayman (KY)

(72) Inventors: Edward J. Nowak, Essex Junction, VT (US); Brent A. Anderson, Jericho, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 23 days.

(21) Appl. No.: 15/198,044

(22) Filed: Jun. 30, 2016

(65) Prior Publication Data

US 2018/0006023 A1    Jan. 4, 2018

(51) Int. Cl.
| | |
|---|---|
| *H01L 29/66* | (2006.01) |
| *H01L 27/088* | (2006.01) |
| *H01L 29/78* | (2006.01) |
| *H01L 29/08* | (2006.01) |
| *H01L 21/8234* | (2006.01) |

(52) U.S. Cl.
CPC .... *H01L 27/088* (2013.01); *H01L 21/823475* (2013.01); *H01L 29/0847* (2013.01); *H01L 29/66666* (2013.01); *H01L 29/7827* (2013.01)

(58) Field of Classification Search
CPC ........... H01L 27/088; H01L 21/823475; H01L 29/0847; H01L 29/66666; H01L 29/7827
USPC ......................................................... 257/329
See application file for complete search history.

(56) References Cited

U.S. PATENT DOCUMENTS

| | | | |
|---|---|---|---|
| 8,900,954 B2 * | 12/2014 | Adkisson | .......... H01L 21/28026 257/E21.409 |
| 2015/0221767 A1 | 8/2015 | Anderson et al. | |
| 2015/0243765 A1 | 8/2015 | Anderson et al. | |
| 2016/0163811 A1 | 6/2016 | Anderson et al. | |

* cited by examiner

*Primary Examiner* — Hrayr A Sayadian
(74) *Attorney, Agent, or Firm* — Thompson Hine LLP; Yuanmin Cai

(57) ABSTRACT

Structures and fabrication methods for vertical-transport field-effect transistors. The structure includes a vertical-transport field-effect transistor having a source/drain region located in a semiconductor layer, a fin projecting from the source/drain region in the semiconductor layer, and a gate electrode on the semiconductor layer and coupled with the fin. The structure further includes an interconnect located in a trench defined in the semiconductor layer. The interconnect is coupled with the source/drain region or the gate electrode of the vertical-transport field-effect transistor, and may be used to couple the source/drain region or the gate electrode of the vertical-transport field-effect transistor with a source/drain region or a gate electrode of another vertical-transport field-effect transistor.

20 Claims, 12 Drawing Sheets

US 9,887,192 B2

1

INTERCONNECTS FOR VERTICAL-TRANSPORT FIELD-EFFECT TRANSISTORS

BACKGROUND

The present invention relates to semiconductor device fabrication and integrated circuits and, more specifically, to structures for vertical-transport field-effect transistors, as well as methods of fabricating device structures for vertical-transport field-effect transistors.

Common transistor structures include a source, a drain, a channel situated between the source and drain, and a gate electrode configured to respond to a gate voltage by selectively connecting the source and drain to each another through the channel. Transistor structures are formed on a surface of a semiconductor substrate, which surface may be considered to be contained in a horizontal plane. Transistor structures can be broadly categorized based upon the orientation of the channel relative to the surface of the semiconductor substrate.

Planar transistors constitute a category of transistor structures in which the channels are oriented parallel to the substrate surface. Vertical transistors represent a different category of transistor structures in which the channels are aligned vertical to the substrate surface. Because the gated current between the source and drain is directed through the channel, different types of vertical transistors, namely Fin-FETs, and vertical-transport field-effect transistors, can also be distinguished from each another based upon the direction of current flow. The gated current in the channel between the source and drain of a FinFET-type vertical transistor is generally parallel to the substrate surface. In contrast, the gated current in the channel between the source and drain in a vertical-transport field-effect transistor is generally perpendicular to the substrate surface.

Improved structures and fabrication methods are needed for vertical-transport field-effect transistors.

SUMMARY

According to an embodiment, a structure includes a vertical-transport field-effect transistor having a source/drain region located in a semiconductor layer, a fin projecting from the source/drain region in the semiconductor layer, and a gate electrode on the semiconductor layer and coupled with the fin. The structure further includes an interconnect located in a trench defined in the semiconductor layer. The interconnect is coupled with the source/drain region or the gate electrode of the vertical-transport field-effect transistor.

According to another embodiment, a method includes forming a source/drain region of a vertical-transport field-effect transistor located in a semiconductor layer, forming a fin of the vertical-transport field-effect transistor that projects from the source/drain region, and forming a gate electrode of the vertical-transport field-effect transistor on the semiconductor layer. The gate electrode is coupled with the fin. The method further includes forming a trench in the semiconductor layer, and forming an interconnect located in the trench and coupled with the source/drain region or the gate electrode of the vertical-transport field-effect transistor.

BRIEF DESCRIPTION OF THE DRAWINGS

The accompanying drawings, which are incorporated in and constitute a part of this specification, illustrate various embodiments of the invention and, together with a general

2 description of the invention given above and the detailed description of the embodiments given below, serve to explain the embodiments of the invention.

Figure 1:
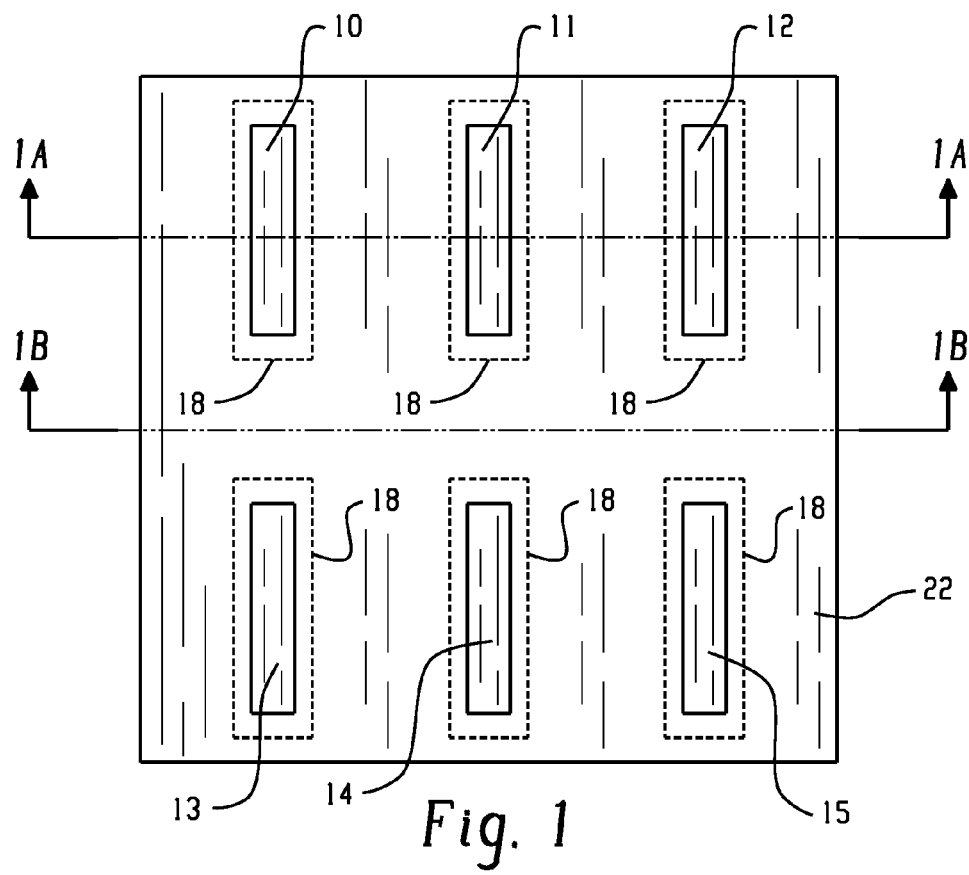

FIG. 1 is a top view of a structure for a vertical-transport field-effect transistor at an initial fabrication stage of a processing method in accordance with an embodiment of the invention.

Figure 1A:
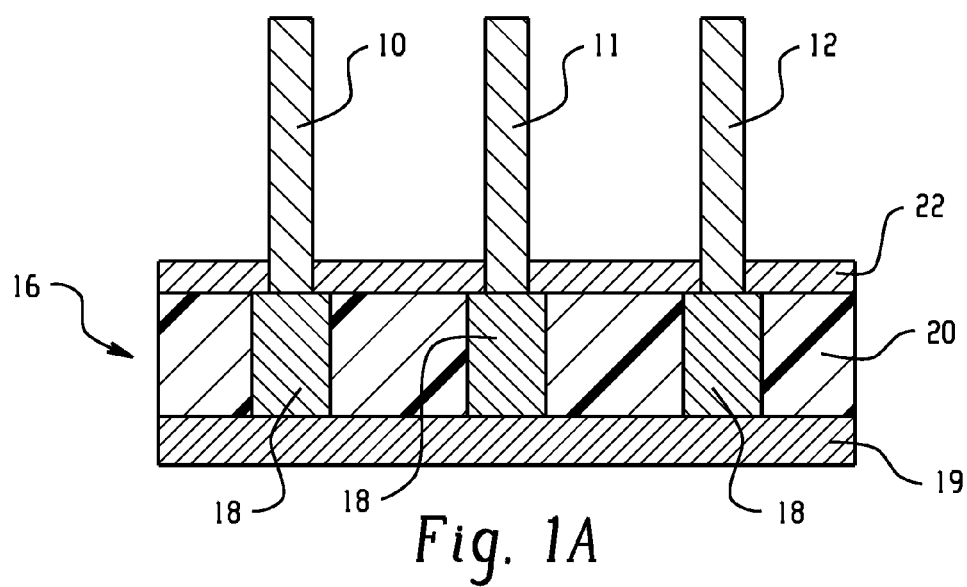

FIG. 1A is a cross-sectional view taken generally along line 1A-1A in FIG. 1.

Figure 1B:
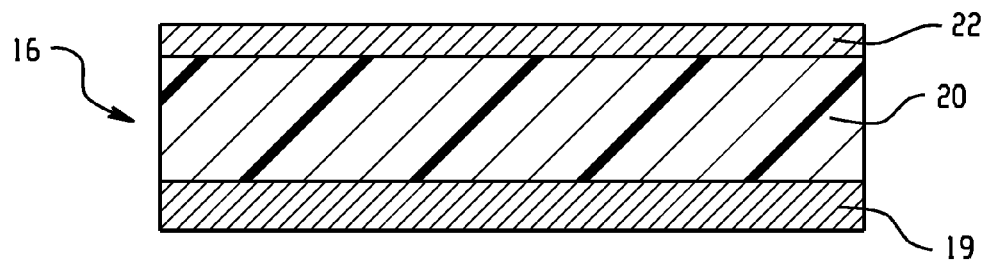

FIG. 1B is a cross-sectional view taken generally along line 1B-1B in FIG. 1.

Figure 2A:
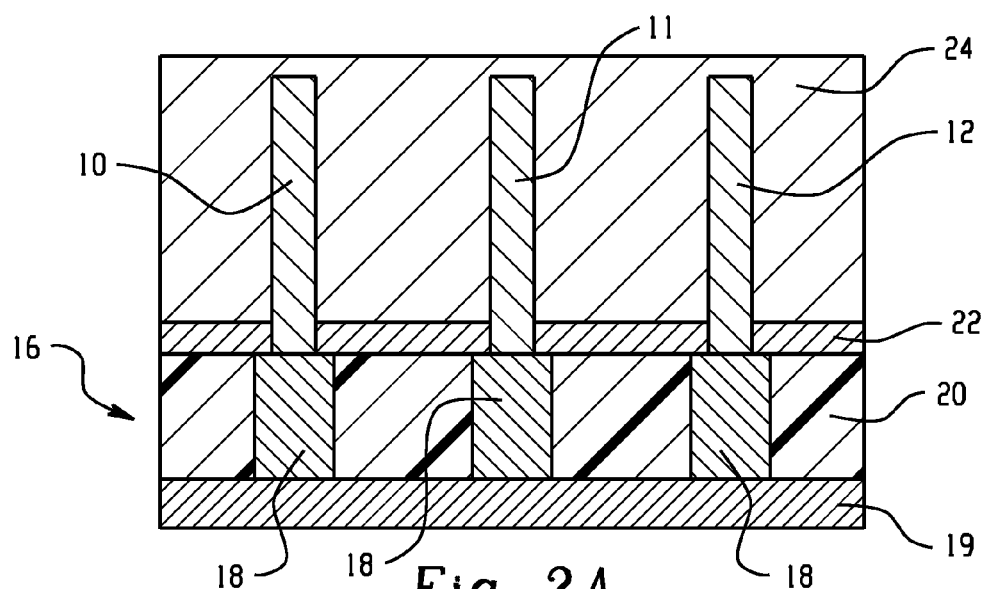
Figure 2B:
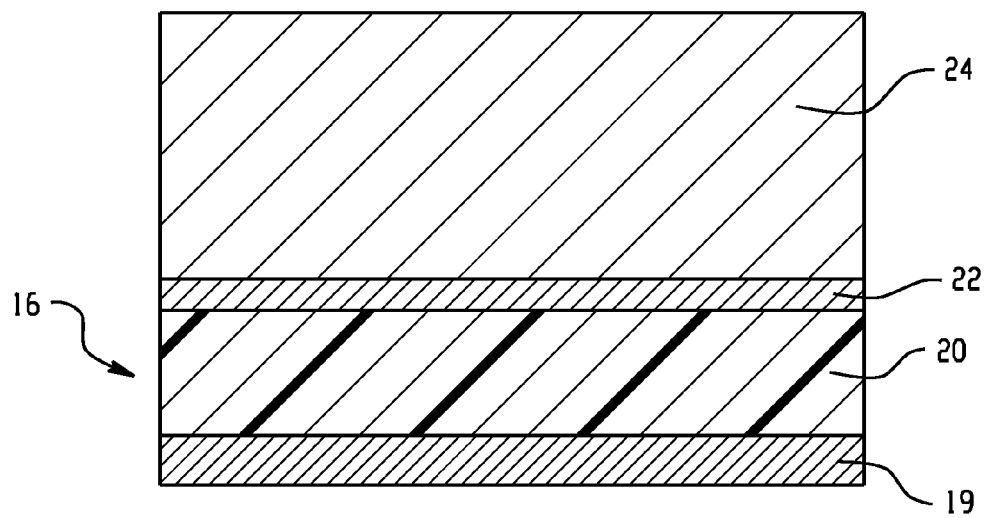

FIGS. 2A, 2B are cross-sectional views at a fabrication stage of the processing method subsequent to FIGS. 1, 1A, 1B.

Figure 3A:
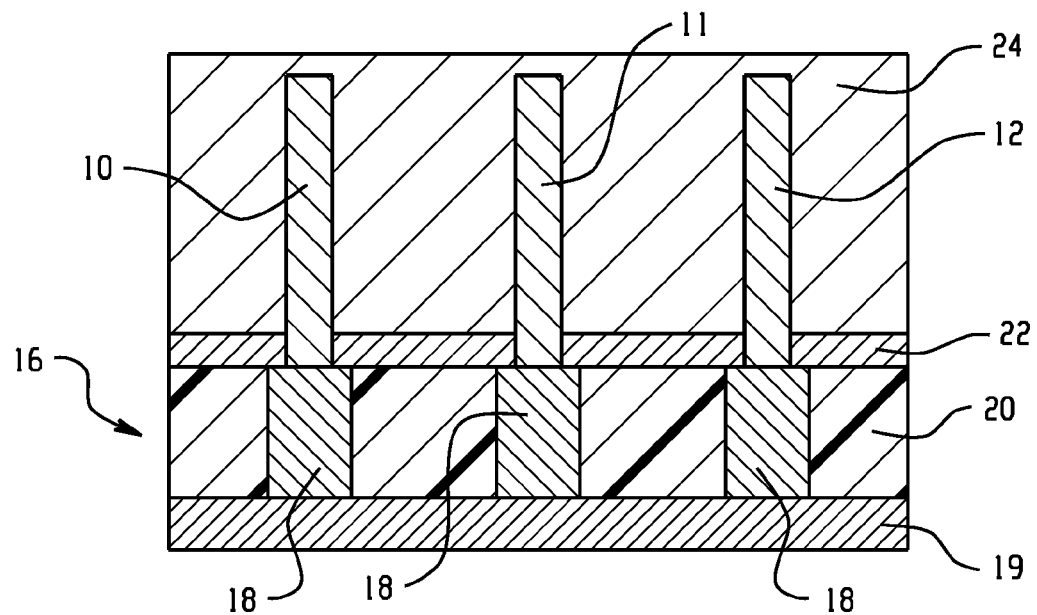
Figure 3B:
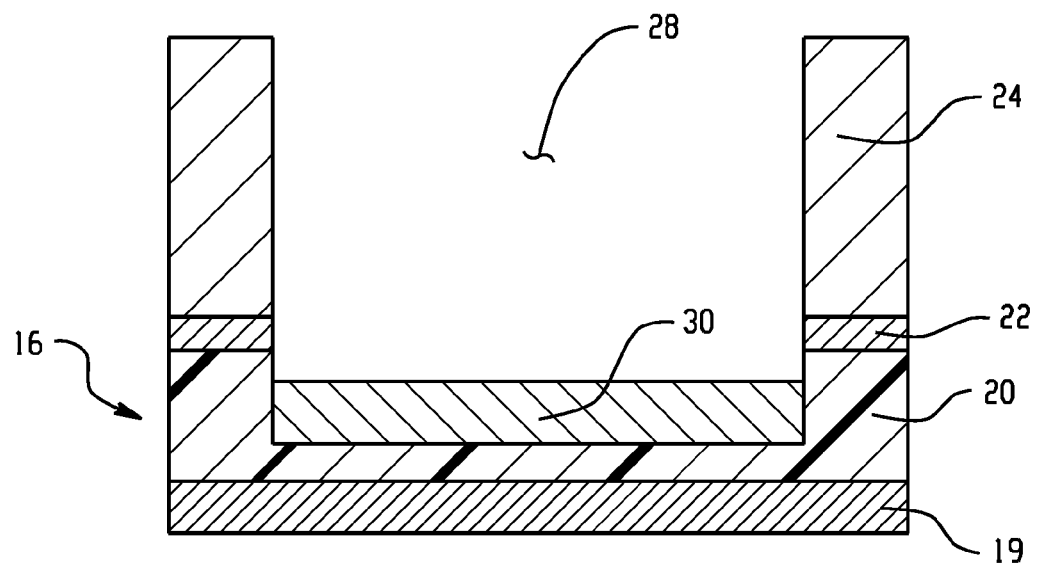

FIGS. 3A, 3B are cross-sectional views at a fabrication stage of the processing method subsequent to FIGS. 2A, 2B.

Figure 4A:
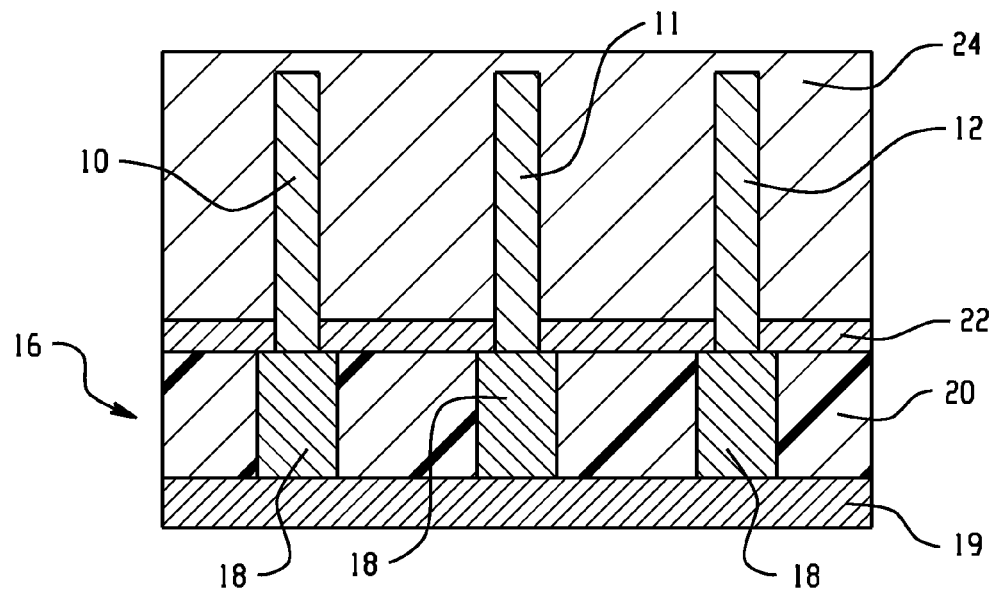
Figure 4B:
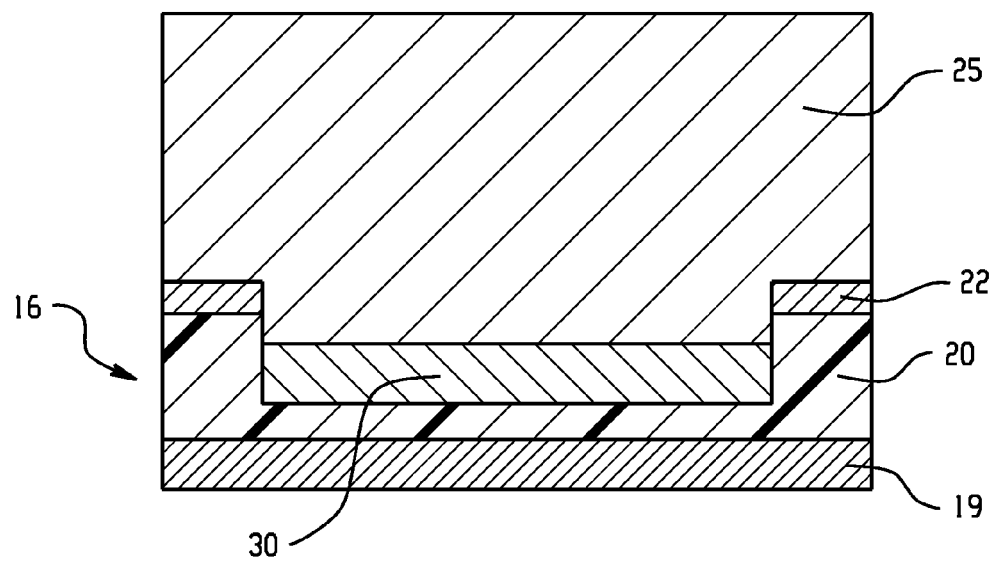

FIGS. 4A, 4B are cross-sectional views at a fabrication stage of the processing method subsequent to FIGS. 3A, 3B.

Figure 5A:
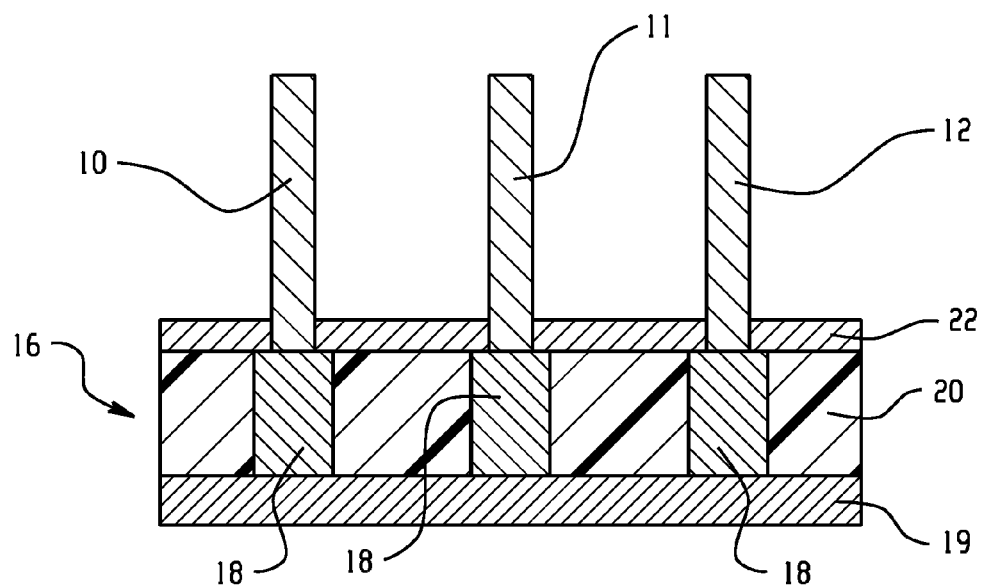
Figure 5B:
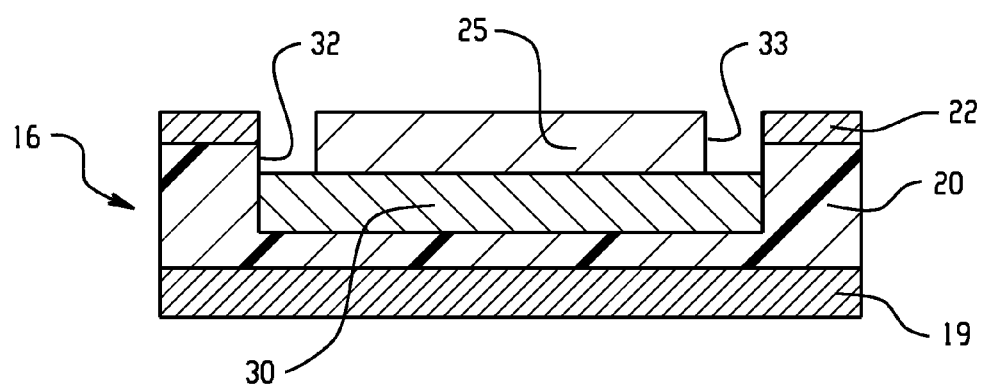

FIGS. 5A, 5B are cross-sectional views at a fabrication stage of the processing method subsequent to FIGS. 4A, 4B.

Figure 6:
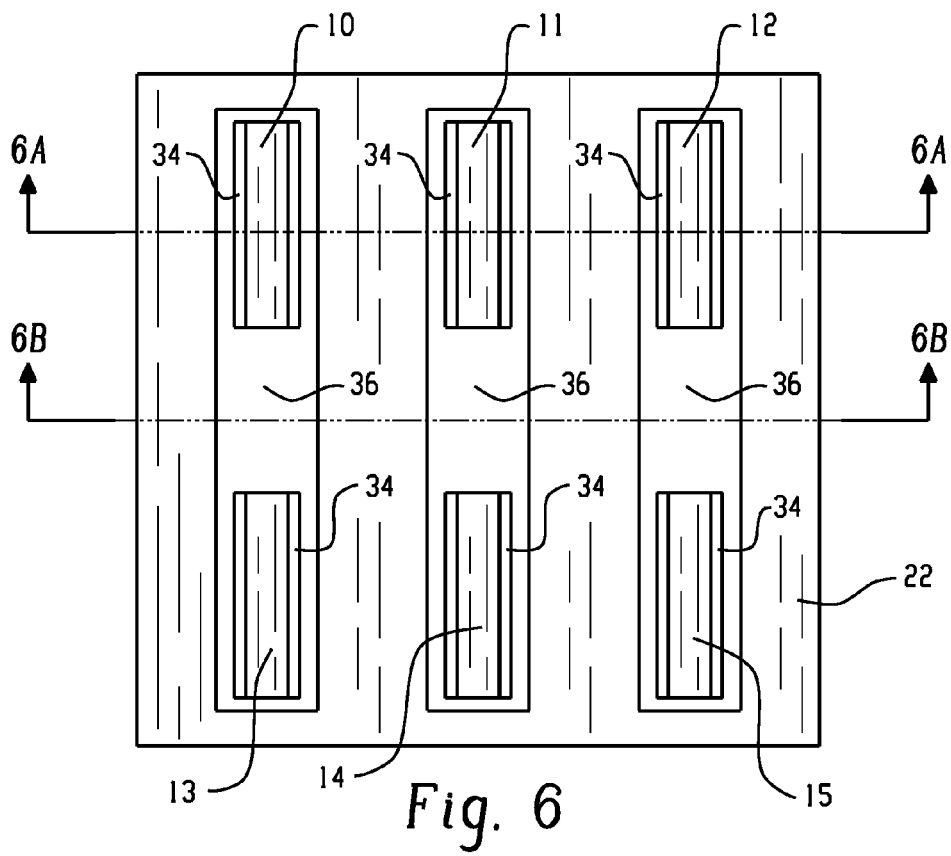

FIG. 6 is a top view of the structure similar to FIG. 1 at a fabrication stage of the processing method subsequent to FIGS. 5A, 5B.

Figure 6A:
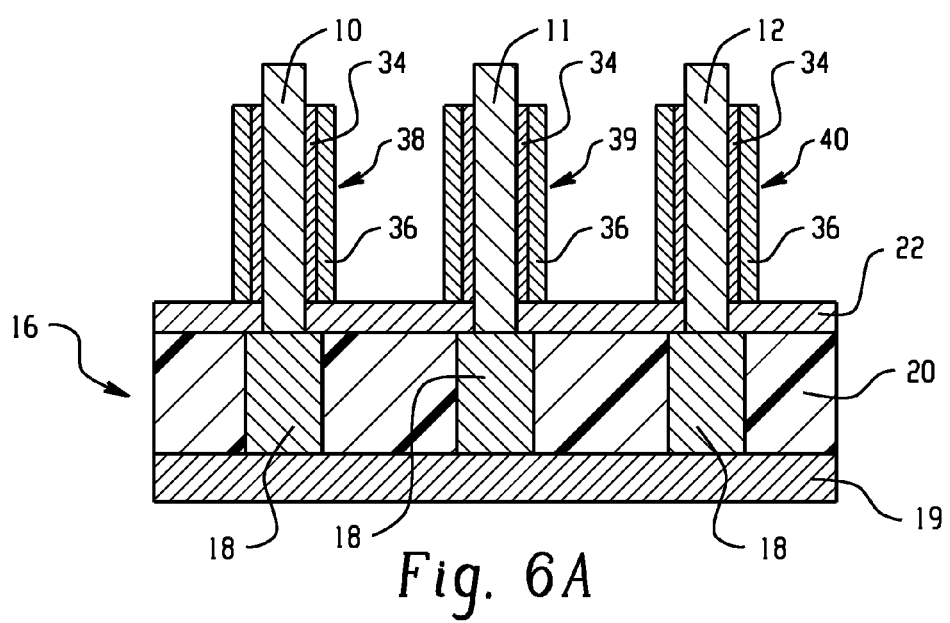

FIG. 6A is a cross-sectional view taken generally along line 6A-6A in FIG. 6.

Figure 6B:
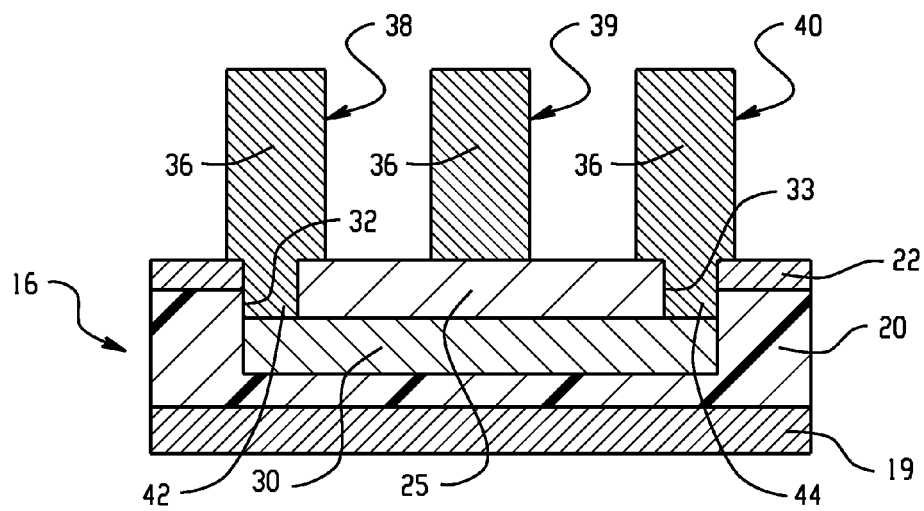

FIG. 6B is a cross-sectional view taken generally along line 6B-6B in FIG. 6.

Figure 7:
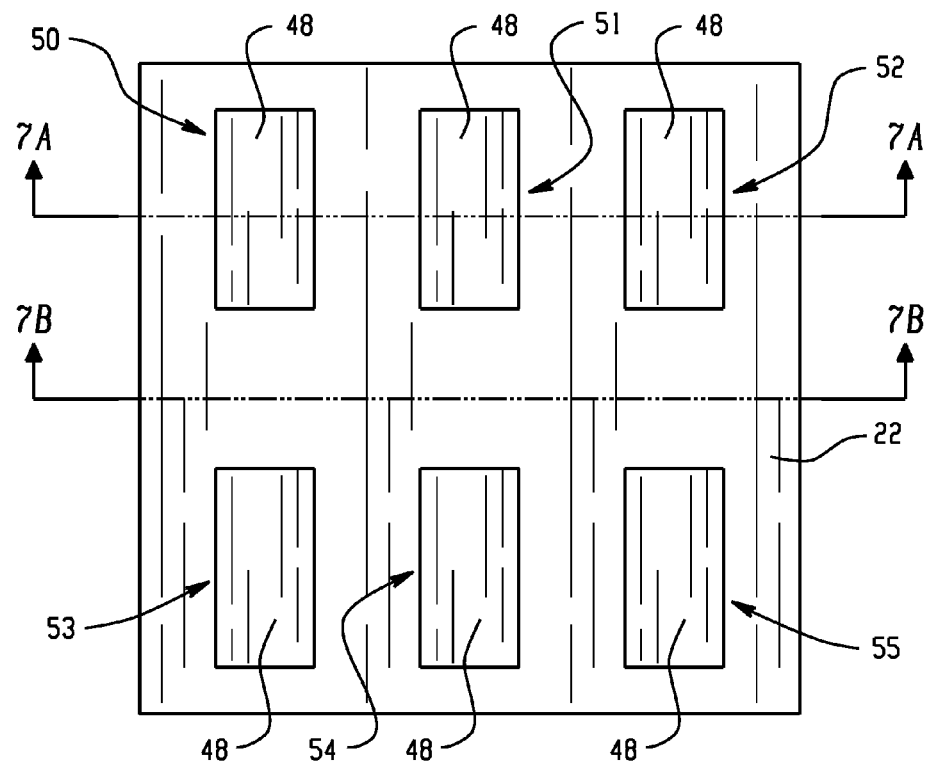

FIG. 7 is a top view of the structure at a fabrication stage of the processing method subsequent to FIGS. 6, 6A, 6B.

Figure 7A:
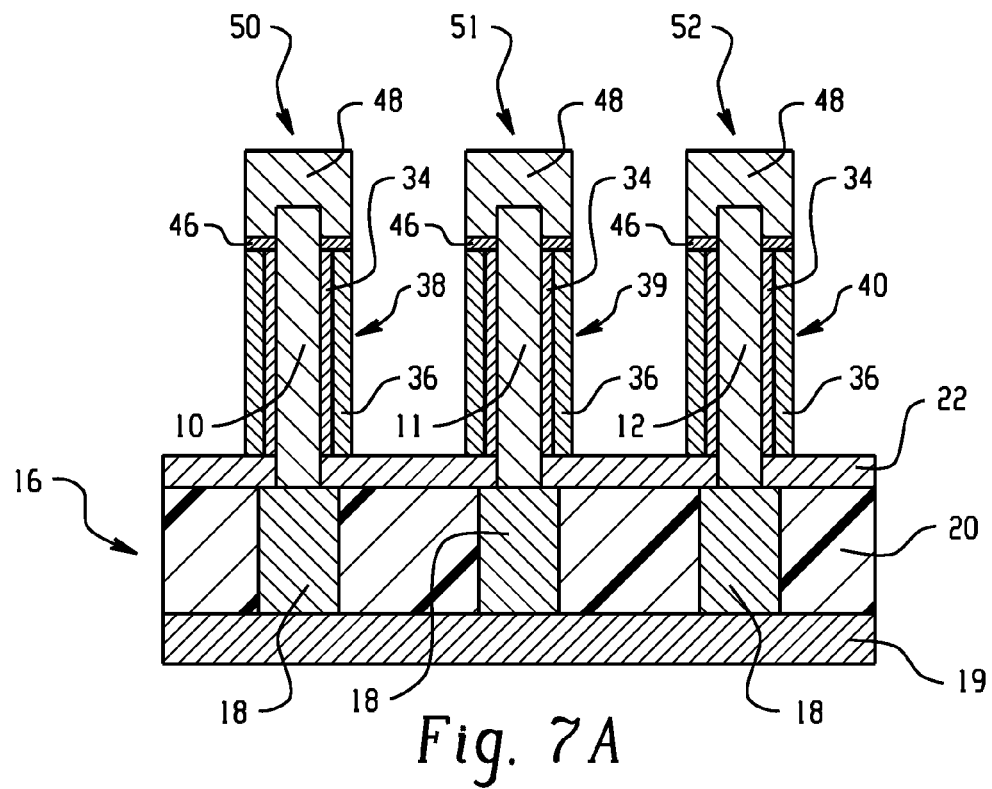

FIG. 7A is a cross-sectional view taken generally along line 7A-7A in FIG. 7.

Figure 7B:
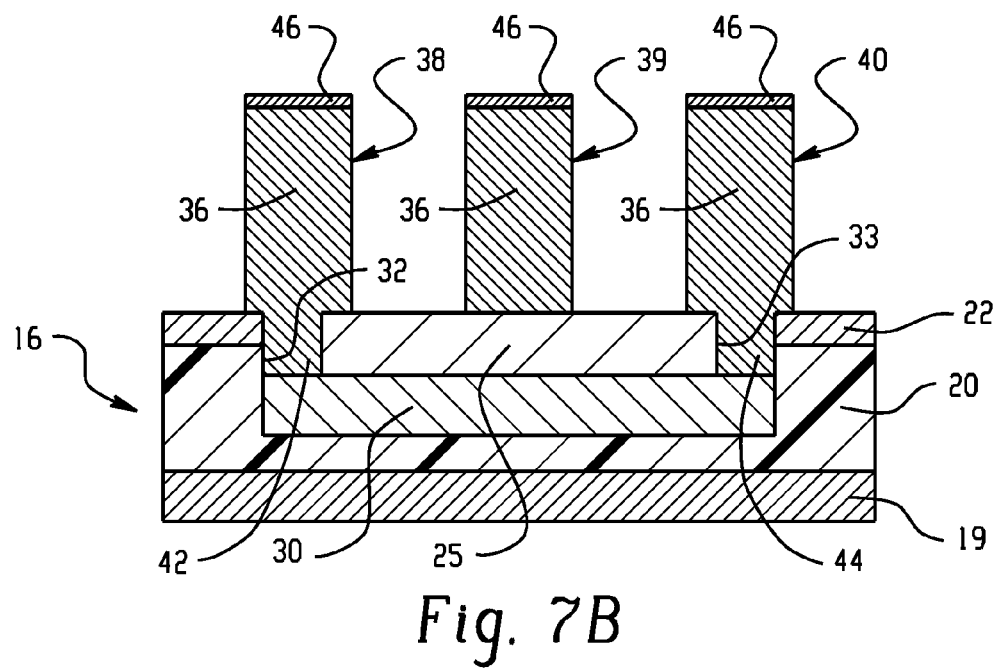

FIG. 7B is a cross-sectional view taken generally along line 7B-7B in FIG. 7.

Figure 8:
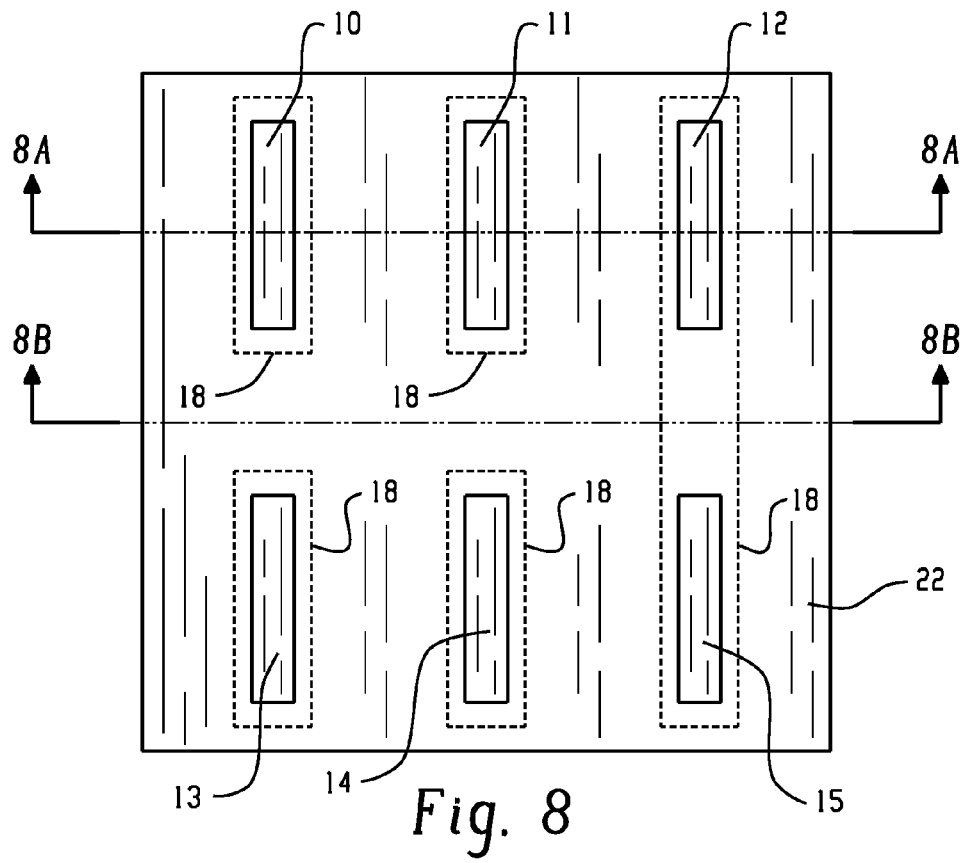

FIG. 8 is a top view of a structure for a vertical-transport field-effect transistor at an initial fabrication stage of a processing method in accordance with an alternative embodiment of the invention.

Figure 8A:
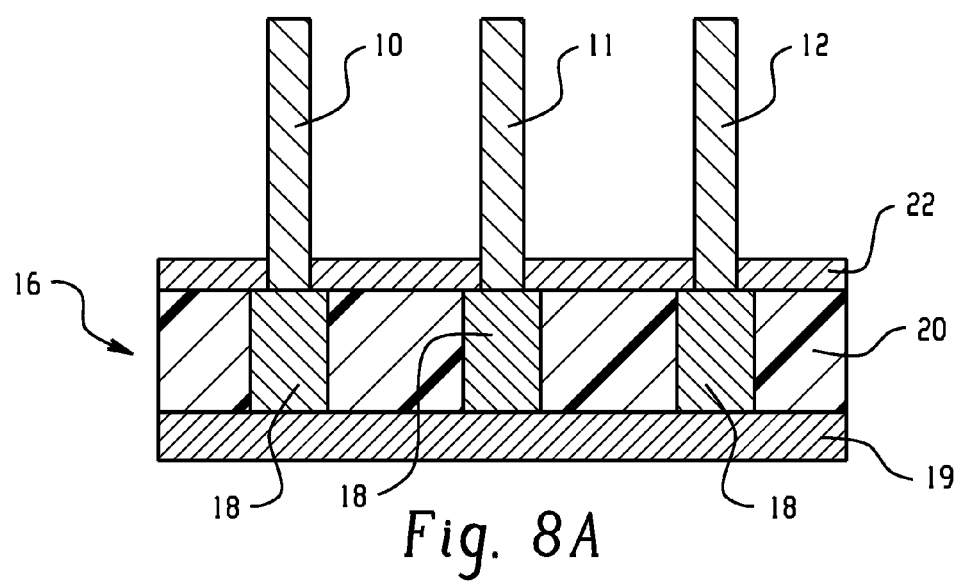

FIG. 8A is a cross-sectional view taken generally along line 8A-8A in FIG. 8.

Figure 8B:
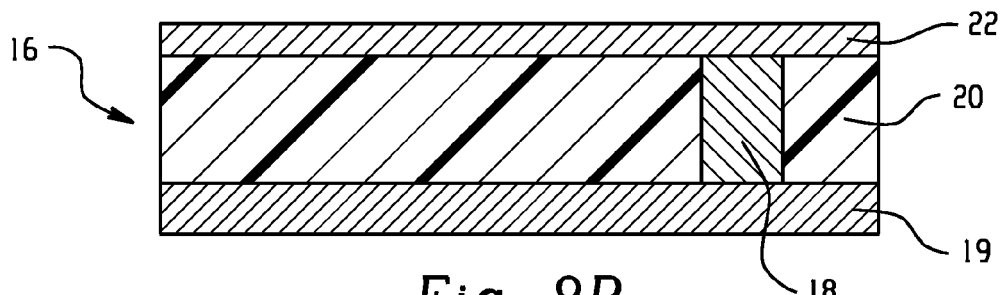

FIG. 8B is a cross-sectional view taken generally along line 8B-8B in FIG. 8.

Figure 9A:
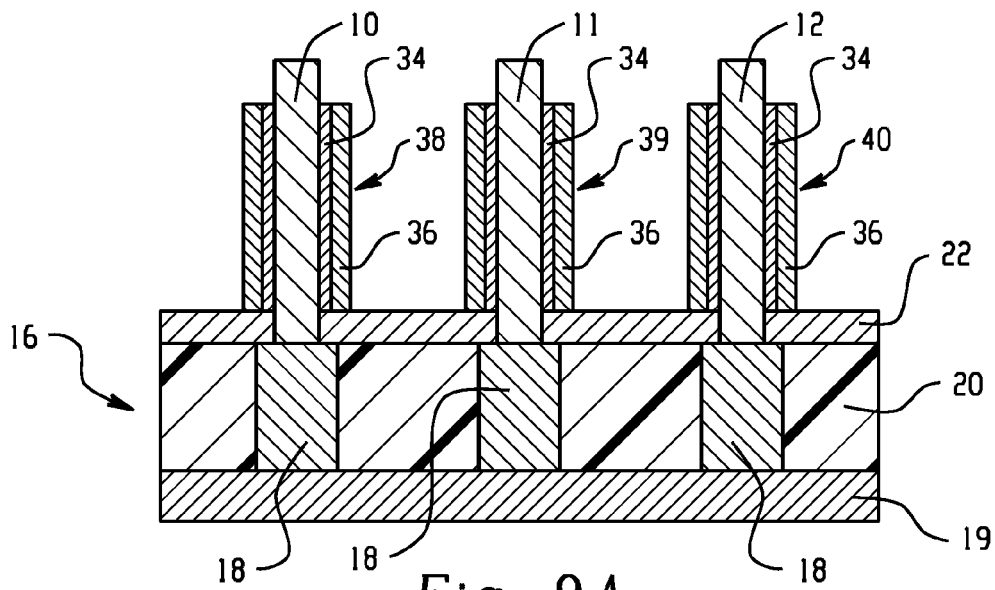
Figure 9B:
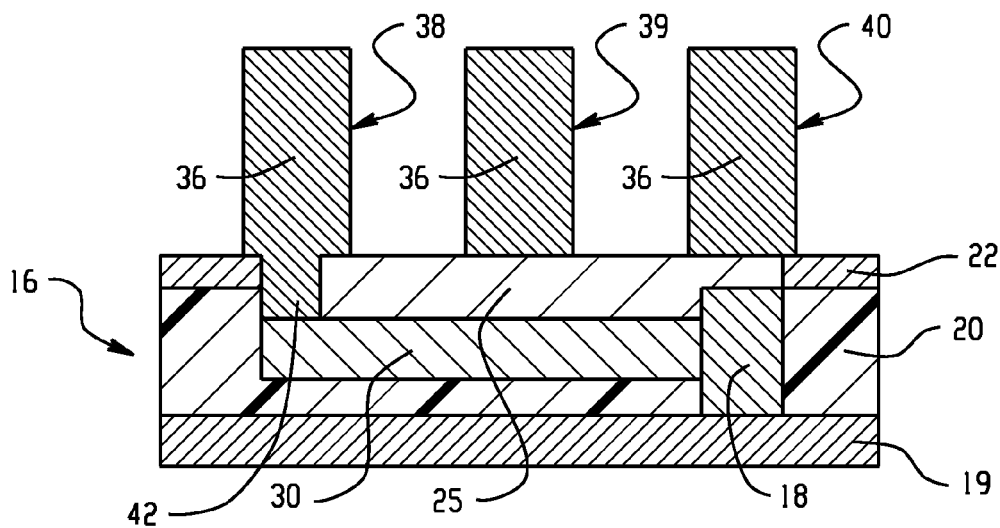

FIGS. 9A, 9B are cross-sectional views following fabrication stages of the processing method subsequent to FIGS. 8, 8A, 8B.

Figure 10:
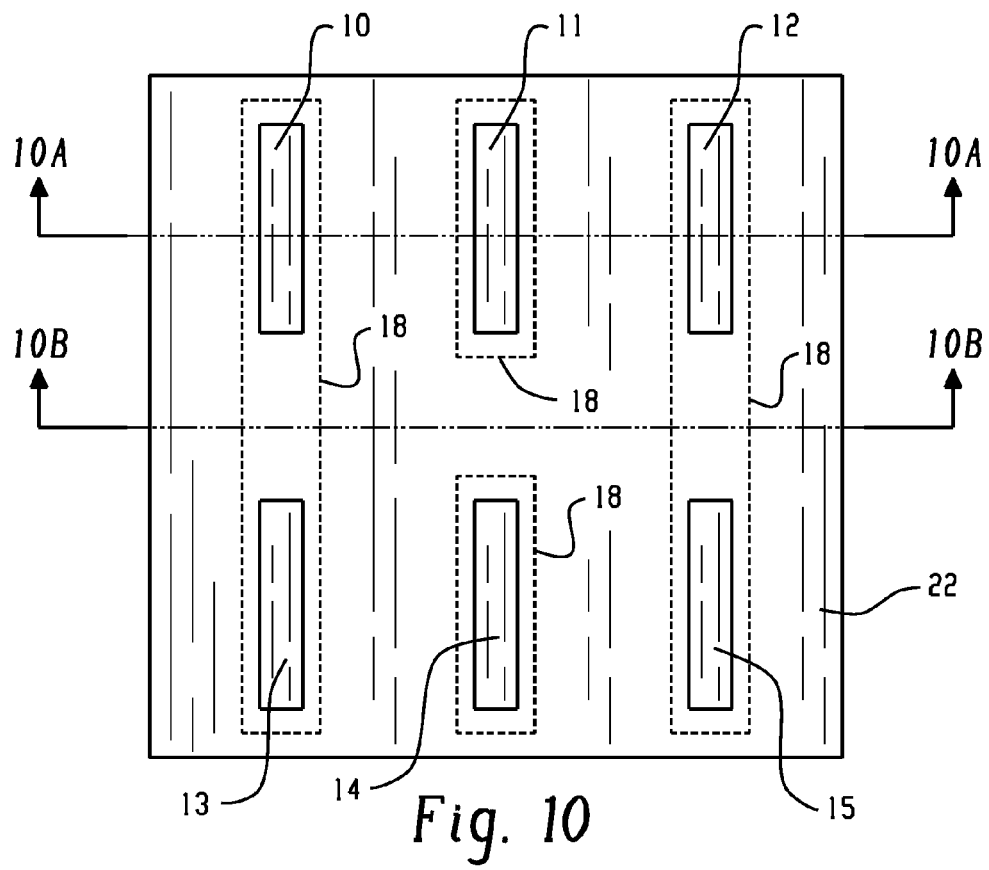

FIG. 10 is a top view of a structure for a vertical-transport field-effect transistor at an initial fabrication stage of a processing method in accordance with an alternative embodiment of the invention.

Figure 10A:
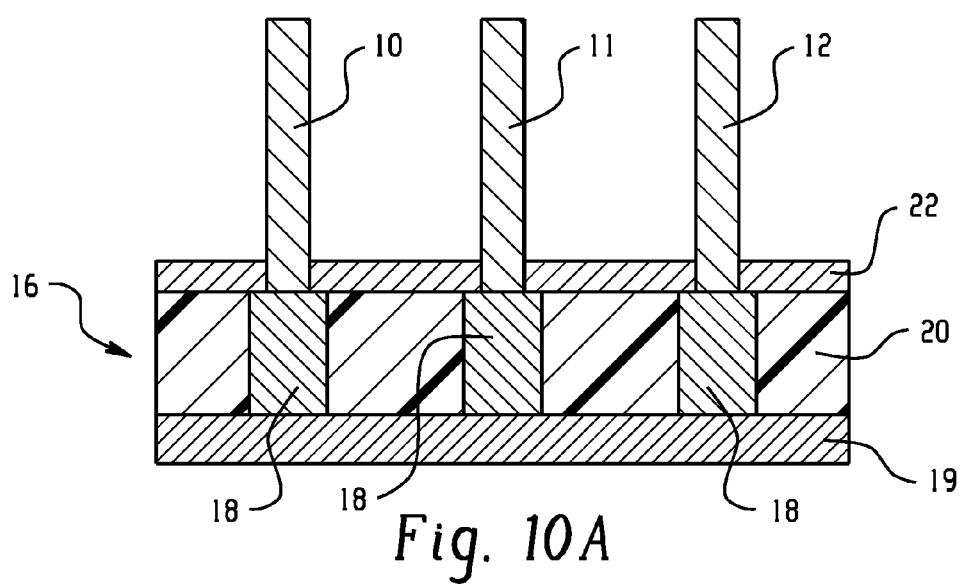

FIG. 10A is a cross-sectional view taken generally along line 10A-10A in FIG. 10.

Figure 10B:
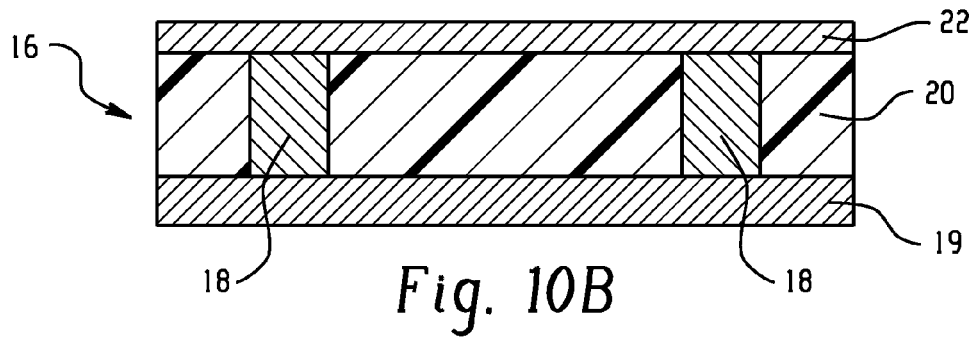

FIG. 10B is a cross-sectional view taken generally along line 10B-10B in FIG. 10.

Figure 11A:
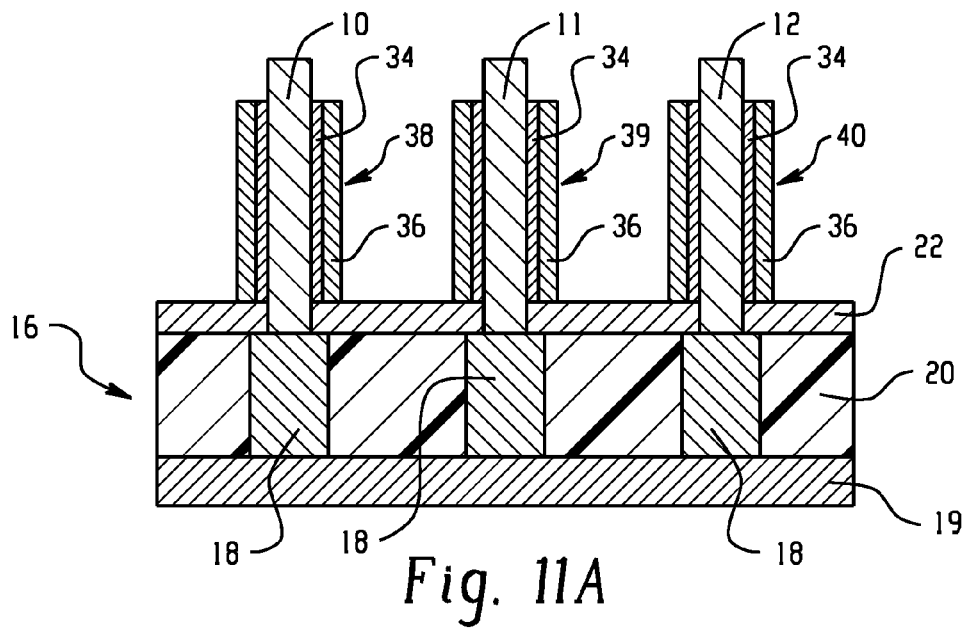
Figure 11B:
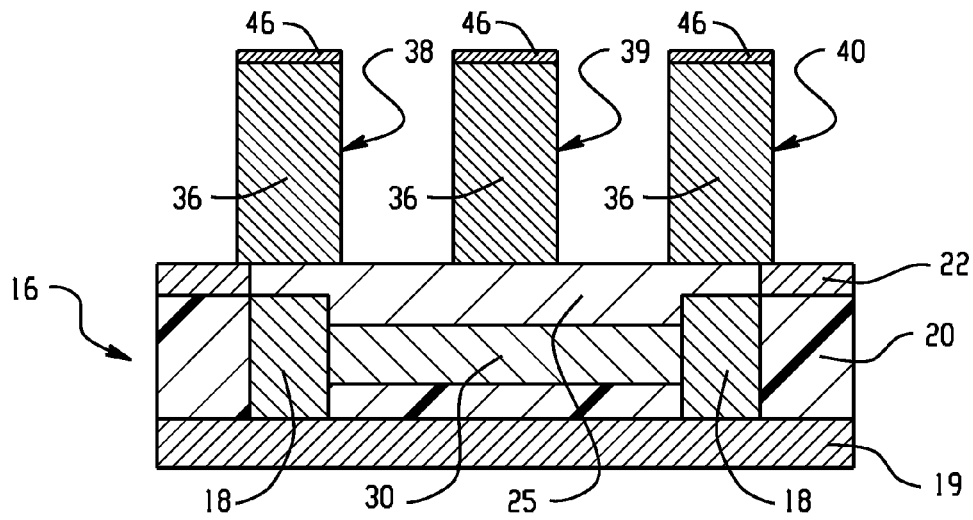

FIGS. 11A, 11B are cross-sectional views following fabrication stages of the processing method subsequent to FIGS. 10, 10A, 10B.

DETAILED DESCRIPTION

With reference to FIGS. 1, 1A, 1B and in accordance with an embodiment of the invention, fins 10-15 are formed from a semiconductor material of a substrate 16, which may be a bulk substrate or a device layer of a semiconductor-on-insulator (SOI) substrate. In the representative embodiment, the substrate 16 is an SOI substrate that includes a semiconductor layer 20, a buried oxide layer 19, and a handle wafer (not shown) that is separated from the semiconductor layer 20 by the buried oxide layer 19. Each of fins 10-15 is a three-dimensional body comprised of semiconductor material originating from the substrate 16, and each may be covered by a respective cap (not shown). The fins 10-15 may be formed by photolithography and etching processes, such as a sidewall imaging transfer (SIT) process that promotes dense packing. The sidewalls of each of the fins 10-15 are oriented vertical to the top surface of the substrate 16, and are contained in planes that are aligned parallel to each.

A source/drain region 18 is formed in the semiconductor layer 20 at the bottom or base of each of the fins 10-15. The lower end of each of the fins 10-15 is coupled with one of the source/drain regions 18. The source/drain region 18 may be formed by filling trenches adjacent to the base of each of the fins 10-15 with a doped semiconductor material and annealing to cause diffusion from the doped semiconductor material in the semiconductor material of the semiconductor layer 20 directly beneath each of the fins 10-15. Each source/drain region 18 may be comprised of n-type epitaxial silicon if subsequently used to construct n-type field-effect transistors (NFETs) or, alternatively, may be comprised of p-type epitaxial silicon if subsequently used to construct p-type field-effect transistors (PFETs). In an embodiment, fins 10-12 may be used to form NFETs and fins 13-15 may be used to form PFETs.

A spacer layer 22 is formed on the surface of the semiconductor layer 20 and covers the semiconductor layer 20 and source/drain regions 18. The spacer layer 22 may be comprised of silicon dioxide ($SiO_2$), silicon nitride ($Si_3N_4$), SiBCN, etc.

With reference to FIGS. 2A, 2B in which like reference numerals refer to like features in FIGS. 1, 1A, 1B and at a subsequent fabrication stage, a dielectric layer 24 may be formed by depositing an electrical insulator to fill the open spaces surrounding the fins 10-15, and then planarizing the electrical insulator using, for example, chemical mechanical polishing (CMP). The dielectric layer 24 may be comprised of a dielectric material, such as an oxide of silicon (e.g., silicon dioxide ($SiO_2$)) deposited by chemical vapor deposition (CVD). The thickness of the dielectric layer 24 is greater than the height of the fins 10-15 such that respective top surfaces of the fins 10-15 are located beneath the top surface of the dielectric layer 24, and may be attributable to caps (not shown) located on the top surfaces of the fins 10-15 that operate as a polish stop during planarization.

With reference to FIGS. 3A, 3B in which like reference numerals refer to like features in FIGS. 2A, 2B and at a subsequent fabrication stage, a trench 28 is formed that extends through the dielectric layer 24 and the spacer layer 22, and penetrates into but not through the semiconductor layer 20. Instead, the trench 28 only penetrates partially through the semiconductor layer 20 so that a partial thickness of the semiconductor layer 20 is located above the buried oxide layer 19. Fins 10-12 and their source/drain regions 18 are horizontally located on one side of the trench 28, and fins 13-15 and their source/drain regions 18 are horizontally located on an opposite side of the trench 28. In this embodiment, the trench 28 does not intersect any of the source/drain regions 18. For example, the trench 28 is laterally located between the source/drain region 18 of fin 10 and the source/drain region 18 of fin 13.

The trench 28 may be formed by etching with a patterned sacrificial mask layer applied to the planarized top surface of dielectric layer 24. The mask layer may include, for example, a photoresist layer that is applied with a spin coating process, pre-baked, exposed to a radiation projected through a photomask, baked after exposure, and developed with a chemical developer to define a pattern with an opening localized between the fins 10-12 and fins 13-15 at a particular location for a trench. With the mask layer present, the trench 28 is etched using one or more wet chemical or dry etch processes, which may rely on one or more given etch chemistries and/or a timed etch to provide the partial penetration through the semiconductor layer 20.

A conductor layer 30 is formed inside the trench 28 and on the semiconductor material of the semiconductor layer 20. The conductor layer 30 may be comprised of a material with a high electrical conductivity, such as doped polysilicon, a metal such as tungsten, or a combination of these and other conductive materials, deposited by chemical vapor deposition (CVD) or another deposition technique. In particular, the material constituting the conductor layer 30 has a higher electrical conductivity than the surrounding semiconductor material of the semiconductor layer 20, an opposite conductivity-type than the semiconductor layer 20, and the same conductivity type as the source/drain regions 18. The thickness of the conductor layer 30 is selected such that a top surface of the conductor layer 30 is located below a plane containing the top surfaces of the source/drain regions 18. Due to the location of the trench 28, the conductor layer 30 is also horizontally located between the source/drain regions 18 of fins 10-12 and the source/drain regions 18 of fins 13-15. However, in this embodiment, the conductor layer 30 is electrically isolated from all of the source/drain regions 18. Any excess conductor on the top surface of the dielectric layer 24 may be removed by, for example, chemical mechanical polishing (CMP).

With reference to FIGS. 4A, 4B in which like reference numerals refer to like features in FIGS. 3A, 3B and at a subsequent fabrication stage, a dielectric layer 25 is deposited to fill the trench 28 above the level of conductor layer 30. The dielectric layer 25 may be comprised of the same electrical insulator as the dielectric layer 24, or may be comprised of a different electrical insulator or may be deposited by a different deposition technique. The planarity of the top surface of the dielectric layer 24 may be restored by, for example, chemical mechanical polishing (CMP).

With reference to FIGS. 5A, 5B in which like reference numerals refer to like features in FIGS. 4A, 4B and at a subsequent fabrication stage, the dielectric layer 24 may be removed in the vicinity of fins 10-15 such that the fins 10-15 are exposed above the level of the spacer layer 22. The dielectric layer 25 is also partially, but not completely, removed such that a thickness of the dielectric layer 25 remains inside a portion of the trench 28 above the conductor layer 30. For example, a wet chemical etching process may be used to etch the dielectric layers 24, 25 by removing the dielectric layers 24, 25 selective to (i.e., at a higher etch rate than) the material of the spacer layer 22. If the dielectric layers 24, 25 are comprised of a silicon dioxide, the wet chemical etching process may utilize a wet chemical etchant containing hydrofluoric acid (HF).

The portion of the dielectric layer 25 overlying the conductor layer 30 is then etched using a sacrificial mask layer to define openings 32, 33 that extend through the dielectric layer 25 to a top surface of the conductor layer 30. The openings 32, 33 may be located at or near the opposite ends of the conductor layer 30. The dielectric layer 25 remains between the penetrating openings 32, 33 located at the opposite ends of the conductor layer 30. The top surface of the conductor layer 30 is accessible through the openings 32, 33.

With reference to FIGS. 6, 6A, 6B in which like reference numerals refer to like features in FIGS. 5A, 5B and at a subsequent fabrication stage, gate stacks 38-40 are formed on the spacer layer 22 and are respectively associated with the fins 10-15. A gate dielectric 34 is applied as a layer to the exterior surfaces of the fins 10-15, and a layer of an electrically conductive material is deposited and patterned using photolithography and etching processes to define a gate electrode 36 of each gate stack 38-40. Fins 10 and 13 share the gate electrode 36 of gate stack 38, fins 11 and 14 share the gate electrode 36 of gate stack 39, and fins 12 and 15 share the gate electrode 36 of gate stack 38. In the vertical arrangement, the gate stacks 38, 40 are located above the top surface of the spacer layer 22 and above the source/drain regions 18. During device operation, the portion of each of the fins 10-15 that is covered by the gate electrode 36 may define a channel for gated carrier flow. An upper end of each of the fins 10-15 projects above the top surface of the gate stacks 38-40.

The gate dielectric 34 may be comprised of an electrical insulator with a dielectric constant (e.g., a permittivity) characteristic of a dielectric material. For example, the gate dielectric 34 may be comprised of silicon dioxide, a high-k dielectric material such as hafnium oxide, or layered combinations of these dielectric materials, deposited by chemical vapor deposition (CVD), atomic layer deposition (ALD), etc. The gate electrodes 36 may be comprised of a metal, a silicide, polycrystalline silicon (e.g., polysilicon), or a combination of these materials deposited by physical vapor deposition (PVD), chemical vapor deposition (CVD), silicidation, etc.

Respective portions of the layer of electrically conductive material used to form the gate electrodes 36 fill the openings 32, 33 in the dielectric layer 25. These portions constitute contacts 42, 44 that couple the gate electrode 36 of the gate stack 38 associated with fins 10 and 13 with the gate electrode 36 of the gate stack 40 associated with fins 12 and 15. In this manner, the conductor layer 30 can be used to couple the different gate electrodes 36 with an interconnect defined by the conductor layer 30. This interconnect is not located in a metallization level formed by either middle-of-line (MOL) processing or back-end-of-line (BEOL) processing. The dielectric layer 25 isolates the gate electrodes 36 of gate stack 39 from the conductor layer 30, and therefore isolated from the interconnect.

In the representative embodiment, fins 10-12 may be used to form NFETs and fins 13-15 may be used to form PFETs, and the arrangement of the gate stacks 38-40 results in multiple inverters being defined as a circuit. The conductor layer 30 operates as an interconnect that couples the gate electrode 36 of gate stack 38 with the gate electrode 36 of gate stack 40, while the gate electrode 36 of gate stack 39 is electrically isolated from the interconnect. This permits the gate electrodes 36 of gate stacks 38, 40 to be driven by the same input signals, while the gate electrode 36 of gate stack 39 can be independently driven by different input signals.

With reference to FIGS. 7, 7A, 7B in which like reference numerals refer to like features in FIGS. 6, 6A, 6B and at a subsequent fabrication stage, spacers 46 are formed on an upper surface of the gate stacks 38-40 with a thickness such that the upper ends of the fins 10-15 still project above the top surface of the gate stacks 38-40. Source/drain regions 48 are formed vertically above the fins 10-15. The source/drain regions 48 are respectively coupled with the upper ends of the fins 10-15. Each source/drain region 48 may be comprised of n-type epitaxial silicon if used to construct n-type field-effect transistors (NFETs) or, alternatively, may be comprised of p-type epitaxial silicon if used to construct p-type field-effect transistors (PFETs). The result of adding the source/drain regions 48 is the formation of vertical-transport field-effect transistors 50-55 with additional elements, including source/drain regions 18, as described previously.

The interconnect based on conductor layer 30 may promote an increase in the circuit density. In the representative embodiment, the interconnect permits the gate electrodes 36 of non-adjacent vertical-transport field-effect transistors 50, 51 and 53, 55 to be interconnected and cross-coupled without interfering with other wiring or pin access. The gate electrodes 36 of vertical-transport field-effect transistors 51, 54 are skipped and lack a connection with the interconnect.

In alternative embodiments, the interconnect provided by the conductor layer 30 and contacts 42, 44 may be used to couple elements of the vertical-transport field-effect transistors 50-55 other than the gate electrodes 36.

With reference to FIGS. 8, 8A, 8B in which like reference numerals refer to like features in FIGS. 1, 1A, 1B and in accordance with an alternative embodiment, one of the source/drain regions 18 may be shared by fin 12 and fin 15, and fins 10, 11, 13, and 14 may have their own discrete source/drain regions 18. The process flow continues as described in FIGS. 2-4 to form the conductor layer 30 in the trench 28 horizontally located between fins 10-12 and fins 13-15 such that fins 10-12 are located on one side of the trench 28 and fins 13-15 are located on an opposite side of the trench 28.

With reference to FIGS. 9A, 9B in which like reference numerals refer to like features in FIGS. 8, 8A, 8B and at a subsequent fabrication stage, only opening 32 is formed in the dielectric layer 25 covering the conductor layer 30 as described in the context of FIGS. 5A, 5B. When the gate electrode 36 of the gate stack 38 is formed as described in the context of FIGS. 6, 6A, 6B, a portion of the constituent electrically conductive material forms the contact 42 in opening 32. Opening 33 and the associated contact 44 are omitted from the device construction. Consequently, one end of the conductor layer 30 is electrically isolated from the overlying gate electrode 36 of gate stack 40. The conductor layer 30 operates as an interconnect that couples the source/drain region 18 shared by fins 10, 13 with the gate electrode 36 in the gate stack 38 shared by fins 10, 13. The process flow continues as described in FIGS. 7, 7A, 7B to form a circuit including the vertical-transport field-effect transistors 50-55.

With reference to FIGS. 10, 10A, 10B in which like reference numerals refer to like features in FIGS. 1, 1A, 1B and in accordance with an alternative embodiment, one of the source/drain regions 18 may be shared by fin 10 and fin 13, another of the source/drain regions 18 may be shared by fin 12 and fin 15, and fins 11 and 14 may have their own discrete source/drain regions 18. The process flow continues as described in FIGS. 2-4 to form the conductor layer 30 in the trench 28 located between fins 10-12 and fins 13-15 such that fins 10-12 are located on one side of the trench 28 and fins 13-15 are located on an opposite side of the trench 28.

With reference to FIGS. 11A, 1B in which like reference numerals refer to like features in FIGS. 10, 10A, 10B and at a subsequent fabrication stage, neither of the openings 32, 33 is formed in the dielectric layer 25 covering the conductor layer 30 as described in the context of FIGS. 5A, 5B. When the gate electrode 36 of the gate stack 38 is formed as described in the context of FIGS. 6, 6A, 6B, neither of the contacts 42, 44 are formed due to the absence of the openings 32, 33. The gate electrodes 36 are all electrically isolated from the conductor layer 30 by the dielectric layer 25 in trench 28. The conductor layer 30 operates as an interconnect that couples the source/drain region 18 shared by fins 10, 13 with the source/drain region 18 shared by fins 10, 13. The process flow continues as described in FIGS. 7, 7A, 7B to form a circuit including the vertical-transport field-effect transistors 50-55.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a first vertical-transport field-effect transistor having a source/drain region located in a semiconductor layer, a fin projecting from the source/drain region in the semiconductor layer, and a gate electrode on the semiconductor layer and coupled with the fin; and
   an interconnect located in a trench defined in the semiconductor layer, the interconnect coupled with the source/drain region or the gate electrode of the first vertical-transport field-effect transistor.

2. The structure of claim 1 wherein the interconnect is coupled with the source/drain region of the first vertical-transport field-effect transistor, further comprising:
   a second vertical-transport field-effect transistor having a source/drain region located in the semiconductor layer, a fin projecting from the source/drain region in the semiconductor layer, and a gate electrode on the semiconductor layer and coupled with the fin,
   wherein the source/drain region of the first vertical-transport field-effect transistor is coupled by the interconnect with the source/drain region or the gate electrode of the second vertical-transport field-effect transistor.

3. The structure of claim 2 wherein the interconnect directly couples the source/drain region of the first vertical-transport field-effect transistor with the source/drain region of the second vertical-transport field-effect transistor.

4. The structure of claim 3 wherein the interconnect includes a conductor layer that is directly coupled with the source/drain region of the first vertical-transport field-effect transistor and that is directly coupled with the source/drain region of the second vertical-transport field-effect transistor.

5. The structure of claim 2 wherein the interconnect couples the source/drain region of the first vertical-transport field-effect transistor with the gate electrode of the second vertical-transport field-effect transistor.

6. The structure of claim 5 wherein the interconnect is comprised of a conductor layer that is directly coupled with the source/drain region of the first vertical-transport field-effect transistor, and further comprising:
   a dielectric layer on the conductor layer, the dielectric layer including an opening extending to the conductor layer; and
   a contact in the opening, the contact directly coupling the conductor layer with the gate electrode of the second vertical-transport field-effect transistor.

7. The structure of claim 1 wherein the interconnect is coupled with the gate electrode of the first vertical-transport field-effect transistor, and further comprising:
   a second vertical-transport field-effect transistor having a source/drain region located in the semiconductor layer, a fin projecting from the source/drain region in the semiconductor layer, and a gate electrode on the semiconductor layer and coupled with the fin,
   wherein the gate electrode of the first vertical-transport field-effect transistor is coupled by the interconnect with the gate electrode of the second vertical-transport field-effect transistor.

8. The structure of claim 7 wherein the interconnect includes a conductor layer that is coupled with the gate electrode of the first vertical-transport field-effect transistor and that is coupled with the gate electrode of the second vertical-transport field-effect transistor.

9. The structure of claim 8 further comprising:
   a dielectric layer on the conductor layer, the dielectric layer including a first opening and a second opening each extending to the conductor layer;
   a first contact in the first opening, the first contact directly coupling the conductor layer with the gate electrode of the first vertical-transport field-effect transistor; and
   a second contact in the second opening, the second contact directly coupling the conductor layer with the gate electrode of the second vertical-transport field-effect transistor.

10. The structure of claim 7 further comprising:
    a third vertical-transport field-effect transistor having a source/drain region located in the semiconductor layer, a fin aligned parallel with the fin of the first vertical-transport field-effect transistor and projecting from the source/drain region in the semiconductor layer, and a gate electrode on the semiconductor layer and coupled with the fin, the fin of the third vertical-transport field-effect transistor horizontally located between the fin of the first vertical-transport field-effect transistor and the fin of the second vertical-transport field-effect transistor; and a dielectric layer at least partially covering the interconnect such that the gate electrode of the third vertical-transport field-effect transistor is electrically isolated from the interconnect.

11. The structure of claim 1 further comprising:

a dielectric layer on the conductor layer, the dielectric layer positioned between the conductor layer and the gate electrode of the first vertical-transport field-effect transistor.

12. The structure of claim 11 wherein the dielectric layer includes an opening extending to the conductor layer, and further comprising:

a contact in the opening, the contact directly coupling the conductor layer with the gate electrode of the first vertical-transport field-effect transistor.

13. A method comprising:

forming a source/drain region of a first vertical-transport field-effect transistor located in a semiconductor layer;

forming a fin of the first vertical-transport field-effect transistor that projects from the source/drain region;

forming a gate electrode of the first vertical-transport field-effect transistor on the semiconductor layer, wherein the gate electrode is coupled with the fin;

forming a trench in the semiconductor layer; and forming an interconnect located in the trench and coupled with the source/drain region or the gate electrode of the first vertical-transport field-effect transistor.

14. The method of claim 13 wherein the interconnect is coupled with the source/drain region of the first vertical-transport field-effect transistor, further comprising:

forming a source/drain region of a second vertical-transport field-effect transistor in the semiconductor layer;

forming a fin of the second vertical-transport field-effect transistor that projects from the source/drain region of the second vertical-transport field-effect transistor;

forming a gate electrode of the second vertical-transport field-effect transistor that is located on the semiconductor layer and coupled with the fin of the second vertical-transport field-effect transistor, wherein the source/drain region or the gate electrode of the second vertical-transport field-effect transistor is coupled by the interconnect with the source/drain region of the first vertical-transport field-effect transistor.

15. The method of claim 14 wherein forming the interconnect comprises:

forming a conductor layer that is directly coupled with the source/drain region of the first vertical-transport field-effect transistor and that is directly coupled with the source/drain region of the second vertical-transport field-effect transistor.

16. The method of claim 14 wherein the interconnect couples the source/drain region of the first vertical-transport field-effect transistor with the gate electrode of the second vertical-transport field-effect transistor, and forming the interconnect comprises:

forming a conductor layer that is directly coupled with the source/drain region of the first vertical-transport field-effect transistor;

forming a dielectric layer on the conductor layer; and forming an opening the dielectric layer extending to the conductor layer; and forming a contact in the opening that directly couples the conductor layer with the gate electrode of the second vertical-transport field-effect transistor.

17. The method of claim 13 wherein the interconnect is coupled with the gate electrode of the first vertical-transport field-effect transistor, further comprising:

forming a source/drain region of a second vertical-transport field-effect transistor in the semiconductor layer;

forming a fin of the second vertical-transport field-effect transistor that projects from the source/drain region of the second vertical-transport field-effect transistor;

forming a gate electrode of the second vertical-transport field-effect transistor that is located on the semiconductor layer and coupled with the fin of the second vertical-transport field-effect transistor, wherein the gate electrode of the second vertical-transport field-effect transistor is coupled by the interconnect with the gate electrode of the first vertical-transport field-effect transistor.

18. The method of claim 17 wherein the interconnect is comprised of a conductor layer, further comprising:

forming a dielectric layer on the conductor layer;

forming a first opening in the dielectric layer that extends to the conductor layer;

forming a second opening in the dielectric layer that extends to the conductor layer;

forming a first contact in the first opening that directly couples the conductor layer with the gate electrode of the first vertical-transport field-effect transistor; and forming a second contact in the second opening that directly couples the conductor layer with the gate electrode of the second vertical-transport field-effect transistor.

19. The method of claim 17 further comprising:

forming a third vertical-transport field-effect transistor having a source/drain region located in the semiconductor layer, a fin aligned parallel with the fin of the first vertical-transport field-effect transistor and projecting from the source/drain region in the semiconductor layer, and a gate electrode on the semiconductor layer and coupled with the fin, wherein the fin of the third vertical-transport field-effect transistor is horizontally located between the fin of the first vertical-transport field-effect transistor and the fin of the second vertical-transport field-effect transistor; and forming a dielectric layer at least partially covering the interconnect such that the gate electrode of the third vertical-transport field-effect transistor is electrically isolated from the interconnect.

20. The method of claim 13 further comprising:

forming a dielectric layer on the conductor layer, the dielectric layer positioned between the conductor layer and the gate electrode of the first vertical-transport field-effect transistor;

forming an opening in the dielectric layer that extends to the conductor layer; and forming a contact in the opening that directly couples the conductor layer with the gate electrode of the first vertical-transport field-effect transistor.

* * * * *

UNITED STATES PATENT AND TRADEMARK OFFICE
CERTIFICATE OF CORRECTION

Page 1 of 1

PATENT NO. : 9,887,192 B2
APPLICATION NO. : 15/198044
DATED : February 6, 2018
INVENTOR(S) : Edward J. Nowak It is certified that error appears in the above-identified patent and that said Letters Patent is hereby corrected as shown below:

In the Claims

At Column 10, Claim number 16, Line number 1, after "opening" insert --in--

Signed and Sealed this
Third Day of April, 2018

Andrei Iancu
*Director of the United States Patent and Trademark Office*